United States Patent [19]

Pastor

[11] Patent Number: 4,605,468
[45] Date of Patent: Aug. 12, 1986

[54] SHAPED CRYSTAL FIBER GROWTH METHOD

[75] Inventor: Antonio C. Pastor, Santa Monica, Calif.

[73] Assignee: Hughes Aircraft Company, Los Angeles, Calif.

[21] Appl. No.: 628,949

[22] Filed: Jul. 10, 1984

[51] Int. Cl.$^4$ ............................................... C30B 15/34
[52] U.S. Cl. .................................. 156/608; 260/707; 156/DIG. 113
[58] Field of Search .................. 156/608, DIG. 113; 422/246; 260/707; 564/73

[56] References Cited

U.S. PATENT DOCUMENTS

| | | | |
|---|---|---|---|
| 3,393,054 | 7/1968 | Rupprecht et al. | 156/608 |
| 4,167,554 | 9/1979 | Fisher | 422/246 |
| 4,211,600 | 7/1980 | Cole | 156/608 |
| 4,264,385 | 4/1981 | Fisher | 156/608 |

*Primary Examiner*—Hiram H. Bernstein
*Attorney, Agent, or Firm*—Victor G. Laslo; A. W. Karambelas

[57] ABSTRACT

An apparatus and method pulling a shaped crystalline fiber of a given crystal-forming material from a liquid reservoir of the material. The apparatus includes a vessel in which the liquid material is maintained as a liquid reservoir at a temperature above the melting point or crystal-forming temperature of the material. A die is provided having an inner-tubular surface which includes a crystal shaping portion which is tapered. The liquid flows from the reservoir through the die so that the liquid flows from the narrow end of the shaping portion to the wide end of the shaping portion. The temperature of the liquid crystal growth material is selectively lowered at the top end of the die to form crystalline material which is continually pulled from the crystal-liquid interface. The apparatus is operated to maintain the crystal-liquid interface within the crystal shaping portion of the die to provide accurate shaping of the crystal by the tubular surface and to maintain accurate alignment of the crystal fiber with the die.

4 Claims, 10 Drawing Figures

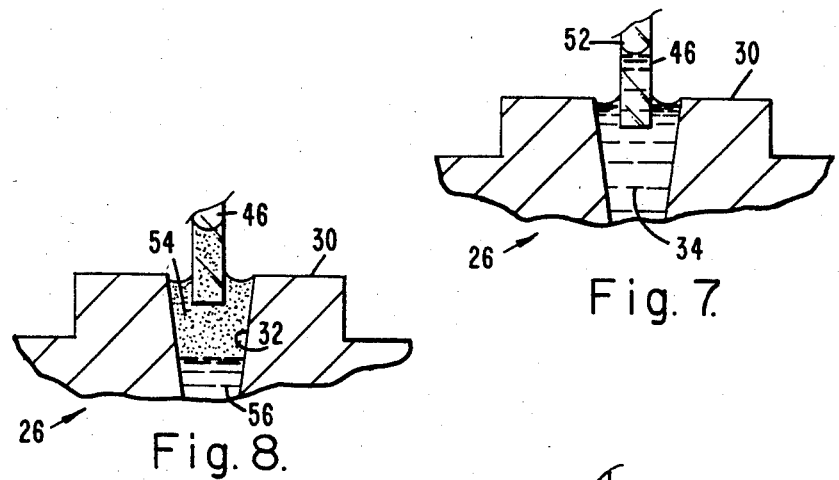
Fig. 7.
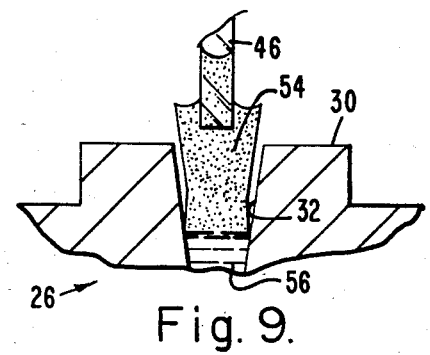
Fig. 8.
Fig. 9.
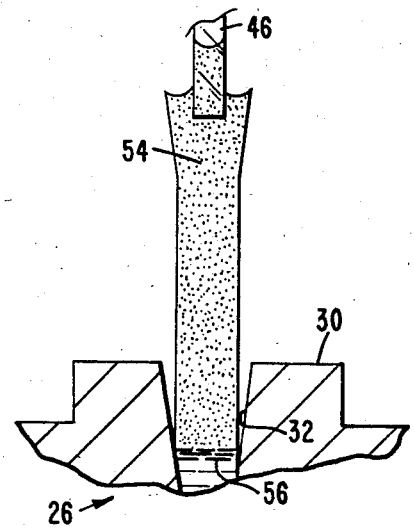
Fig. 10.

SHAPED CRYSTAL FIBER GROWTH METHOD

RIGHTS OF THE UNITED STATES GOVERNMENT

The Government has rights in this invention pursuant to Contract No. F49620-82-C-0030 awarded by the Department of the Air Force.

BACKGROUND OF THE INVENTION

The Bridgman and the Czochralski Methods are well known methods of growing bulk single crystals from the melts of congruently melting compounds. These methods basically involve "pulling" a single crystal from the melt or liquid reservoir of material. The Czochralski method involves pulling the crystal from a position in the melt which is displaced away from the container or crucible walls. The size and shape of the crystal are determined by the temperature distribution around the growth site. Since the container has some influence over the temperature distribution of the melt, it has an indirect influence on the size and shape of the crystal, but such effect is only secondary. The crystal shape and size is primarily determined by the size and shape of the interface formed between the crystal and the melt as the crystal is continually formed and pulled upward from the melt.

Modifications of the Czochralski method have been developed in which the shape of the crystal during growth is controlled by a shaper or die. Typical shaped crystal growth methods include the Stepanov method, as described by Antonov (Antonov, P. I., and Nikanorov, S. P., *Journal of Crystal Growth* 50 3 (1980), or the Edge-Defined Film Fed Growth (EDFG)) method, as described by LaBelle (LaBelle H. E., Jr., *Journal of Crystal Growth* 50, 8 (1980)). These methods are basically modifications of the general Czochralski technique, wherein a shaper or die is provided which has walls that are sufficiently close to the crystal-melt interface to affect and partially control the size and shape of the crystal as it is pulled from the melt as it passes through the shaper.

FIGS. 1 and 2 are schematic representations of the Stepanov method of crystal growth wherein FIG. 1 shows EDFG shaped crystal growth and FIG. 2 depicts a non-wetting melt which does not wet the shaper's surface. As is apparent, the shape of the meniscus of the liquid melt between the crystal and the shaper is determined by the wettability of the shaper surface. Due to the possible variations in meniscus shape, the size of the crystal being pulled through the shape is only partially dependent upon the shaper walls. The actual size of the crystal will depend upon the surface area of the crystal-melt interface, which is, in turn, determined by the wettability of the melt on the shaper as demonstrated in FIGS. 1 and 2. The crystal formed in FIG. 1 will be approximately the same diameter as the outer diameter of the shaper, while the diameter of the crystal formed in FIG. 2 will be approximately the same as the shaper's inside diameter. Thus, the crystal formed in FIG. 1 will be wider than the crystal formed in FIG. 2 even though the shapers are of the same dimensions. This difference is due to the different wetting of the shaper by the melts.

It would be desirable to provide an apparatus in which the size and shape of the crystal are controlled by the shaper only and are not dependent upon the shape of the meniscus of melt material which developes between the crystal and the shaper as is presently the case in shaped crystal growing systems based on the Czochralski method.

A possible solution, to overcome the inherent variability in crystal shape and size for Czochralski-type methods, would be to lower the crystal melt interface into the die as shown by the horizontal dotted line in FIG. 2. However, if the crystal melt interface is lowered into the shaper to accurately control the crystal shape, the resulting surface adhesion and frictional forces between the crystal and the shaper frequently result in breakage of the crystal as it is pulled from the shaper.

In addition to problems involving control of crystal fiber widths, the Czochralski-type systems (where the crystal melt interface is displaced from the shaper walls) also present problems involving alignment of the crystal over the shaper. Continual care must be taken to insure that the crystal is aligned directly over the shaper. Since there is no contact between the crystal and shaper, some external alignment means are required in order to insure that the crystal remains in the desired position over the shaper. As is well known, when pulling crystal fibers of any length, the fibers tend to vibrate. Continual maintenance of crystal alignment over the shaper can be especially difficult when such crystal vibrations occur.

It would be desirable to provide an apparatus for growing shaped crystal fibers in which both the shape and size of the fiber can be accurately controlled over long periods of time, crystal breakage due to adhesion and frictional forces at the shaper wall is minimized, and wherein alignment of the crystal with the shaper is maintained at all times and even during crystal vibrations which may be induced during the crystal pulling process.

SUMMARY OF THE INVENTION

In accordance with the present invention, an apparatus and method are provided in which the shaper is designed to directly contact the crystal during crystal growth in order to provide accurate and uniform control of crystal shape and provide accurate and continual alignment of the crystal with the shaper. The design of the shaper also reduces surface adhesion and frictional forces between the crystal and the shaper.

The present invention is based upon an apparatus which is adapted for pulling a shaped crystalline fiber of a given crystal-forming material from a liquid reservoir of the material. The apparatus includes a vessel having side walls and a bottom adapted to contain the liquid reservoir of material. Means are provided for heating the vessel to maintain the material in the reservoir at a temperature above the crystal-forming temperature for the material.

A die is provided having a bottom end, a top end and an inner-tubular surface therebetween defining a shaper orifice. The tubular surface includes a crystal shaping portion, having a top end and a bottom end wherein the tubular surface tapers inward from the top end of the shaping portion to the bottom end. Means are provided for mounting the die in relation to the vessel, so that the orifice is continually fed with liquid material from the liquid reservoir with the liquid material entering the orifice through the bottom end and flowing to the crystal formation zone.

Means are provided for selectively lowering the temperature of the material within the crystal formation zone, so that the temperature of the material is at or below the crystal-forming temperature of the material, to thereby form crystalline material. As the crystalline material forms, it produces an outer edge which is directly adjacent to and shaped by the shaping portion of the tubular surface. This allows accurate control of the shape of the crystal and provides an accurate means for aligning the crystal within the orifice. Further, means are provided for continually pulling the crystalline material from the crystal formation zone through the top end of the die, to thereby pull the shaped crystalline fiber from the liquid reservoir.

The apparatus, in accordance with the present invention, is an improvement over existing Czochralski-type systems, since the die is designed to allow direct contact of the forming crystal with the walls of the die. It is believed that the tapered design of the tubular surface which defines the crystal-forming zone reduces the adhesion and frictional forces between the formed crystal and the die to thereby prevent breakage of the crystal as has been comonly experienced with prior crystal shaping systems. The provision of direct crystal-die contact, in accordance with the present invention, provides numerous advantages which are not available from prior art systems wherein the crystal does not contact the die or shaper.

As another feature of the present invention, the vessel is provided with a top and a divider wall located above the reservoir top surface, so that the vessel top, side walls and divider wall define a vapor chamber in which the top end of the die is located. Means for selectively lowering the temperature of the material within the crystal formation zone are provided in such a configuration by shutters which can be opened to the atmosphere outside the vessel in order to provide controlled cooling of the crystal formation zone to the desired crystal formation temperature. The chamber may also be used as a treatment zone, into which various gaseous reagents are introduced for treating the crystalline fiber as it is pulled from the die orifice.

As another feature of the present invention, the die orifice is a capillary sized orifice which is sufficiently small to draw liquid material into the orifice by capillary action. As another feature, the die is mounted vertically with the bottom end of the die below the reservoir top surface and the top end of the die above the reservoir top surface, wherein the liquid material is drawn up into the crystal-forming zone by capillary action. Additional advantages are provided by forming a chamfer at the top end of the shaping portion of the die by tapering the tubular suface outward at an angle which is sufficiently large to prevent the melt liquid from flowing up past the top end of the shaping portion of the die by capillary action. The chamfer is useful in providing a well-defined initial upper surface of the melted material in the crystal-forming zone, permitting use of a wider pull rod at initiation of crystal growth, and further it is especially well-suited for use when a seed crystal is used to produce crystal matrix alignment, upon initiation of crystal growth at the crystal-forming zone.

The above-discussed and many other features and attendant advantages of the prevent invention will become apparent as the invention becomes better understood by reference to the following detailed description when considered in conjunction with the accompanying drawing.

BRIEF DESCRIPTION OF THE DRAWINGS

FIGS. 7-10 are representations showing the steps followed in preparing a shaped crystal fiber in accordance with the present invention.

DETAILED DESCRIPTION OF THE INVENTION

The present invention is directed broadly to growing shaped crystal fibers from liquid materials and especially those which remain liquids above a given melting temperature and crystalline to form a solid crystal below the melting temperature. The present invention is well-suited for use in growing congruently melting materials such as sodium nitrite, urea, benzil, and heavy metal halides. The invention can be used for growing non-congruently melting materials; however, when growing such materials, the temperature of the melt reservoir and the temperature within the crystal-forming zone must be continually changed to correct for the non-congruent crystal formation. The following description will be limited to growing crystals from congruent melting materials with it being understood that the invention may be applied to any liquid system from which crystal growth is possible.

Figure 1:
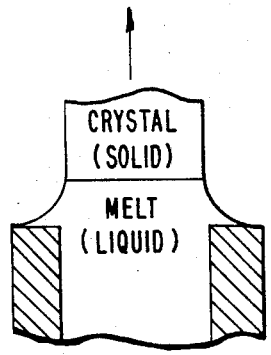
FIG. 1 is a schematic representation of a conventional prior art shaped crystal growing method in which the melt material wets the shaper surface.
Figure 2:
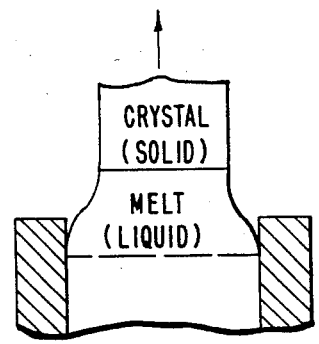
FIG. 2 is a diagram which is similar to FIG. 1, except that a melt is a liquid material which does not wet the walls of the shaper.
Figure 3:
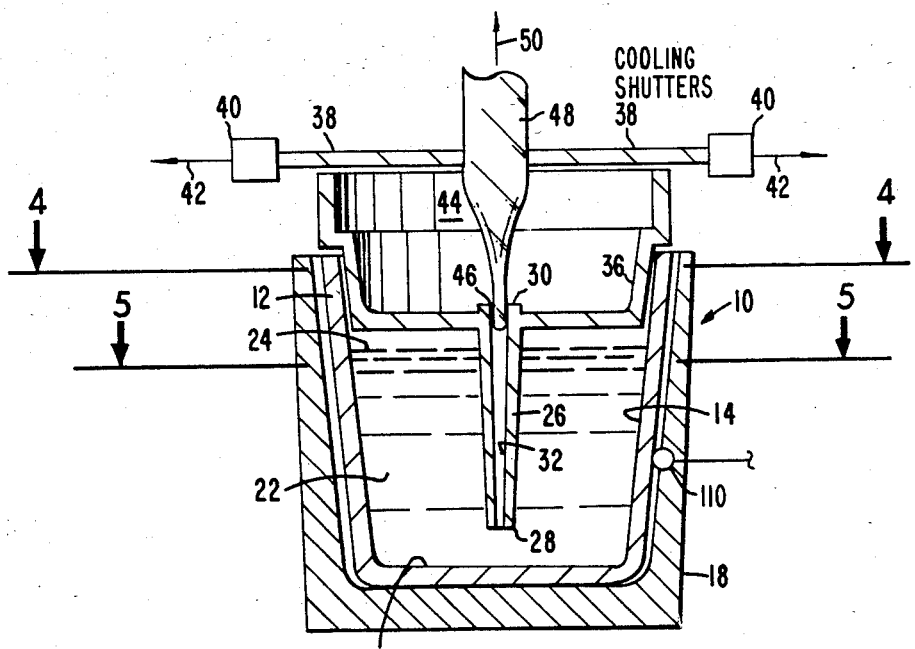
FIG. 3 is a partial schematic sectional view of an exemplary preferred apparatus, in accordance with the present invention.
Figure 4:
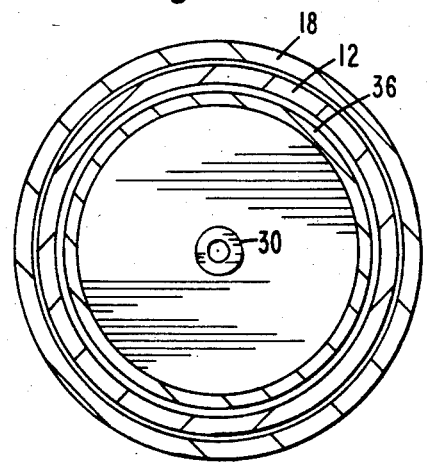
FIG. 4 is a sectional view of FIG. 3 taken in the 4—4 plane.
Figure 5:
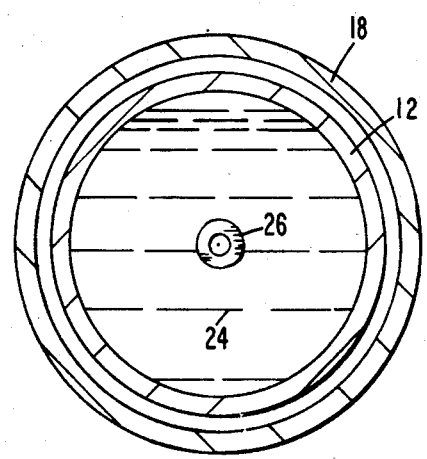
FIG. 5 is a sectional view of FIG. 3 taken in the 5—5 plane.

An exemplary preferred apparatus for use in pulling a shaped crystalline fiber of a given crystal-forming material from a liquid reservoir of the material is shown generally at 10 in FIG. 3. Cross-sectional views of FIG. 3 taken in the 4—4 plane and 5—5 plane are shown in FIG. 4 and FIG. 5, respectively. The apparatus 10 includes a vessel such as crucible 12 having sidewalls 14 and a bottom 16. The crucible 12 is designed to hold various congruently melting materials such as sodium nitrite, urea, benzil, and heavy metal halides. The crucible 12 may be made from any suitable material commonly used in conventional crystal growth systems such as borosilicate glass, fused silica or platinum. The apparatus may be designed to accommodate a growth temperature of 500° C. in which case the crucible 12 may be fabricated from borosilicate glass, or 1,000° C. in which case the crucible 12 may be fabricated from fused silica, or 1,500° C. in which case the crucible 12 may be fabricated from platinum.

Means for heating the crucible 12 is provided by heating mantle 18. The heating mantle 18 may be any of the conventional heating elements commonly used in crystal growth systems. The makeup of the heating mantle and heating elements depends upon the melting point of the particular crystal growth material being processed. A suitable control thermocouple, shown schematically at 110 is provided for maintaining the temperature of the crucible above the melting point or crystal-forming temperature of the crystal growth material.

The heating element 18 is designed to heat the crystal growth material in the crucible to maintain a uniform temperature throughout the crystal growth material to provide a liquid reservoir of material 22 which has a substantially uniform temperature throughout the reservoir 22. The liquid reservoir 22 has a top surface 24. The crucible 12 preferably has a circular perimeter; however, other shapes are suitable so long as the crucible is shaped to promote a uniform temperature throughout the liquid melt reservoir 22.

The shaper or die 26 includes a bottom end 28, a top end 30 and an inner tubular surface 32 which defines orifice 34 (FIG. 7). The tubular surface 32 tapers inward from the top end of the die 30 to the bottom end of the die 28 to provide a crystal formation zone wherein the cross-sectional area of the orifice 34 decreases as one moves from the top end of the die 30 to the bottom end of the die 28. Preferably the orifice will be circular in cross section and have diameters ranging from 0.2 to 1.0 millimeter at the top end down to from 0.1 to 0.5 millimeters at the bottom end. The die may be made from any suitable material such as borosilicate glass, vitreous silica, platinum or other material which is structurally strong at the temperatures required for crystal formation and chemically inert with respect to the crystal growth material.

A convenient means for fabrication of a borosilicate glass or vitreous silica die 26 is to draw a piece of heavy-walled capillary tubing and cut from it a piece that has the desired internal diameter and taper. It is not important that the inner tubular surface of the die 32 taper along the entire length of the die. It is only important that the inner tubular surface 32 taper inward at the location in the die where the crystal-melt interface occurs. The degree of inward taper of surface 32 and the size of orifice 34 may be varied, depending upon the particular crystal growth material and the particular crystal growth conditions, such as temperature, and crystal growth rate. Preferably the degree of inward taper of tubular surface 32 is made as large as possible without preventing the crystal growth material from being drawn up through orifice 34 by capillary action. The degree of taper is believed to affect to the frictional forces between the formed crystal and the die 26 and adhesive forces between the crystal as it forms and the die 26. Such forces determine the minimum degree of taper allowable. For example, in the case of low melting oxides when a circular shaped die is used, a taper of about 0.4 mm/15 mm of die length appears to be minimal. A lesser taper results in the fiber becoming jammed in the orifice. Accordingly, it is desirable to optimize the amount of inward taper of tubular surface 32.

Means for mounting the die in relation to the crucible 12 can be provided by any suitable means such as housing 36. Preferably, the housing 36 is designed to fit on top of crucible 12 to provide a divider wall located above the reservoir top surface 24. The die 26 is preferably mounted as an integral part of housing 36 and positioned vertically with the bottom end of the die 28 located below the reservoir top surface 24 and the top end of the die 30 located above the reservoir top surface 24. The use of housing 36 serves the dual purpose of securely mounting the die 26 in the desired position for crystal growth, while providing a cover for separating the liquid reservoir 22 from the outside atmosphere.

As is well known, in order to form crystalline material from the liquid reservoir 22, it is necessary to lower the temperature of the liquid material below the melting point of the material. Means for selectively lowering the temperature of the liquid material within orifice 34 in order to provide crystalline growth is provided by cooling shutters 38. Shutter controllers shown diagrammatically at 40 are provided to selectively move shutters 38 outward, as indicated by arrows 42 to open chamber 44 to the outside atmosphere, in order to provide cooling of the top end 30 of the die.

The degree to which cooling shutters 38 are opened can be varied, with it being preferred that the temperature at the top of the die 30 be lowered sufficiently to crystallize a portion of the liquid within orifice 34 onto the nucleating tip 46 of pull rod 48. The pull rod 48 may be made from any suitable material commonly used for pulling crystals from crystal growth material melts. A preferred crystal pulling rod 48 can be made from materials such as borosilicate glass or vitreous silica tubing which has been drawn at one end down to a nucleating tip having a diameter appropriate for use with the die orifice dimensions previously discussed, preferably 0.5 millimeters and below. The nucleating tip is quite fragile and must be handled with great care. Once nucleation of the crystal growth material occurs on nucleating tip 46, the pull rod 48 is then pulled upward as indicated by arrow 50 at the desired crystal growth rate.

A more detailed view of the operation of crystal growth apparatus 10 is shown in FIGS. 7-10. Referring to FIG. 7, the nucleating tip 46 is shown in position prior to initiating crystal growth. A portion of the liquid melt present in the orifice 34 is drawn up into the nucleating tip by capillary action as shown at 52. As the liquid moves into nucleating tip 46, the temperature of the liquid decreases, resulting in formation of crystalline substance within the nucleating tip 46. In order to initiate crystal growth, the cooling shutters 38 are opened to provide cooling of the die top 30 as shown in FIG. 8. The cooling of die top 30 results in the formation of crystallized material 54. When the crystal-melt interface 56 reaches the desired position along the tapered surface 32, the pull rod 48 is pulled upward to begin pulling the crystallized material from the die 26. Continued pulling of the pull rod 48 results in formation of the desired crystalline fiber 54 (FIG. 10.).

As is apparent from FIGS. 7-10, the diameter of the crystalline fiber 54 is determined by the vertical position of the crystal-melt interface 56 along the tapered surface 32. This is an especially convenient feature since it allows the size of the crystal 58 to be varied without changing the die 26. For larger diameter crystal fibers, the crystal-melt interface 56 is maintained closer to the top of the die 30. To reduce the crystal fiber diameter, the crystal-melt interface 56 is moved lower into the more narrow portions of the tapered orifice 34. The vertical position of the crystal-melt interface 56 is conveniently controlled by way of cooling shutters 38 in conjunction with other parameters such as the pulling rate of the crystal. Not only does the tapered die surface 32 provide a convenient means for accurately controlling the diameter of crystal 58, the tapered die also provides secure positioning and alignment of the crystal 54 within the die 26 and reduction of the frictional and adhesive forces between the crystal and the die 26 as previously discussed.

Figure 6:
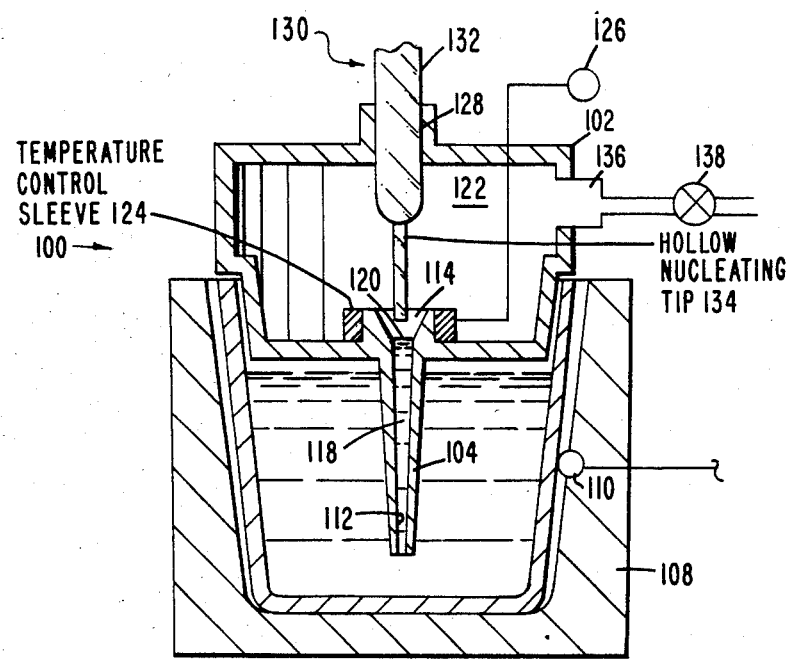
FIG. 6 is a partial schematic sectional view of another exemplary preferred apparatus, in accordance with the present invention.

An alternate embodiment of a preferred apparatus, in accordance with the present invention, is shown generally at 100 in FIG. 6. The apparatus 100 is designed for growing crystals which are sensitive to moist air and not amenable to growth in an open atmosphere system such as the apparatus 10 shown in FIG. 3, in which cooling shutters 38 are used to control the temperature of the top end of the die 30. In addition, the apparatus 100 is designed for use in growing crystals where reactive atmosphere processing (RAP) is desired. RAP crystal growth basically involves utilizing various vaporous reagents to treat the crystal fiber during formation for various purposes such as preventing deterioration or enhancing various properties of the crystal. Procedures for RAP are described in detail in U.S. Pat. Nos. 3,826,817 (1974); 3,932,597 (1976); 3,969,491 (1976); 4,076,574 (1978); and 4,379,733 which are assigned to the same assignee as the present invention.

The crystal growing apparatus 100 is basically the same as the apparatus 10 shown in FIG. 3, except that a different housing 102 and different die 104 is provided. The apparatus 100 basically includes a crucible 106 and heating element 108. The heating element 108 is controlled by thermocouple 110 in the same manner as the heating element 18 described in FIG. 3. The die 104 includes an inner tubular surface 112 which is tapered in a similar manner to the tapered surface 32 in die 26 except that it is additionally provided with a chamfer surface 114 at the top end 116 of the die. The chamfer surface 114 is tapered outward at an angle which is much greater than the tapered angle of the inner tubular surface 112. The taper of chamfer surface 114 is sufficiently large so that the liquid material 118 in die 104 is not drawn by capillary action above the level shown at 120. It should be noted that use of the chamfered surface above the tapered surface 32 of die 26 of apparatus 10 would provide an improvement. Use of the chamfered surface as part of the die in apparatus 100 or in apparatus 10 permits use of a wider pull rod and facilitates use of a seed crystal during initiation of crystal growth.

The housing 102 provides an enclosed container which permits control of the atmosphere in chamber 122. Instead of using shutters to control the temperature of the die top end 116, a temperature control unit such as the temperature control sleeve 124 is used to lower the temperature of the liquid material at 120 in order to provide desired crystal formation. Control of the temperature of sleeve 124 is provided by any suitable thermocouple control device which is represented schematically at 126. Pull rod orifice 128 in housing 102 is provided through which a suitable pull rod may be inserted for use in pulling the crystal fiber. An alternate pull rod configuration is shown at 130. The pull rod includes a borosilicate glass tubing 132 with a hollow nucleating tip 134 of thin-walled capillary platinum tubing. Preferably the platinum tubing has an inside diameter of 0.18 millimeters and an outside diameter of 0.25 millimeters. Platinum tubing with dimensions near the preferred size may also be used, depending upon the size of the die orifice. If desired, instead of utilizing a glass or platinum nucleating tip, a seed crystal may be utilized. The use of seed crystals is preferred where a particular orientation of the crystal structure as it grows is desired. The use of seed crystals for initiating crystallization when growing single crystal fibers from a melt is well known.

The housing 102 includes a reactive gas inlet 136 through which a reactive gas may be controllably introduced into chamber 122. The rate of flow of gas into chamber 122 through inlet 136 and out of chamber 122 through pull rod orifice 128 is controlled by the amount of gas allowed to enter through valve 138 or other suitable mechanism.

When pulling the crystalline fiber from the dies in either apparatus 10 or 100, it is desirable to achieve a steady-state of crystal growth. A steady-state growth is achieved by determining the pulling rate which is slow enough to prevent liquid from periodically seeping up past the crystal-melt or growth interface while being fast enough to prevent the crystal-melt interfaces from continually advancing deeper into the die. If the pull rate is too fast, the material which seeps up past the growth interface freezes onto the fiber, thereby producing an irregular surface. When the pull rate is too slow, the increasing crystal-die interface which is produced as the growth front advances deeper into the die, eventually increases the resistance to crystal pulling, which eventually results in the tensile strength of the fiber being exceeded. It is desirable to use a steady-state growth rate (i.e., the growth rate at which the crystal-melt interface remains stationary) in order to produce a fiber having constant diameter. In order to optimize the steady-state growth rate, it is preferable to begin growth at a more rapid rate than the estimated optimum so that the crystal growth front does not advance into the die to an extent which creates risk of snapping the fiber. The growth rate can be slowed until optimum is achieved without undue experimentation.

Single crystal fibers of sodium nitrite ($NaNO_2$) have been grown by the method described above, utilizing the apparatus shown in FIG. 3. The diameters of the fibers grown range from 0.2 to 0.5 millimeters. The longest fiber grown was a 0.5 millimeter diameter fiber, which was grown in two stages with minor interruption to a length of more than 70 centimeters. The linear growth rate was 1.5 centimeters per hour. The length of this crystal was only limited by the range of the mechanism which was used to retract pull rod 48. The pulling mechanism can be replaced with a reel having a radius greater than the deforming minimum radius of bend curvature for the fiber, to thereby allow pulling of single crystal fibers of unlimited lengths.

Preferred growth rates are around 1.5 centimeters per hour, with growth rates from 0.5 to 2.5 centimeters per hour also being acceptable. The typical fiber surface may have a network of ridges on it. These ridges can be easily smoothed, either by heat polishing or chemical milling in a suitable solvent. In order to reduce the network of ridges, it is preferred to coat the inner surface of the die 32 with an agent which prevents wetting of the surface with the crystal growth liquid. A suitable non-wetting agent, such as gold, can be coated on the interior surface of a vitreous silica die, in order to prevent wetting of that surface by sodium nitrite.

As is apparent from the foregoing, the present invention provides a single crystal fiber growth system and method in which the crystal growth interface is stabilized directly in the die. This overcomes the main problem in prior art systems resulting from the locating of the crystal-melt interface above and away from the shaper. The present invention provides control of fiber diameter and alignment of the fiber with the crystal-forming die which was previously difficult to obtain or not possible with prior methods and systems.

Having thus described exemplary embodiments of the present invention, it should be noted by those skilled in the art that the within disclosures are exemplary only and that various other alternatives, adaptations and modifications may be made within the scope of the present invention. Thus, by way of example and not of limitation, if desired, non-congruent melting solids may be suitably used for single crystal fiber growth. In order to accommodate the growth of such non-congruent melting materials, it would be necessary to continually adjust the temperatures of both the liquid reservoir and the top end of the crystal-forming die to maintain the crystal growth interface at the desired steady-state position within the tapered die orifice. Accordingly, the present invention is not limited to the specific embodiments as illustrated herein and is only limited by the following claims.

What is claimed is:

1. A method for pulling a shaped crystalline fiber of a given crystal-forming material from a liquid reservoir of said material comprising the steps of:
   providing a liquid reservoir of said material having a top surface and maintaining the temperature of the liquid reservoir above the crystal-forming temperature of said material;
   introducing said liquid material into the bottom end of the die having a tubular orifice, said bottom end of the die located below the top surface of the reservoir;
   flowing said liquid material to a crystal-forming zone in said orifice, said crystal-forming zone having a cross-section which tapers outward toward the top end of the die and downstream relative to the flow of said liquid material and such that said liquid material is in direct contact with said crystal-forming zone;
   providing a thermal gradient along the length of said crystal-forming zone so that a liquid/crystal interface occurs within said crystal-forming zone, the crystalline material at said liquid/crystal interface having an outer edge that forms directly adjacent the inner surface of said die and being shaped thereby; and
   continually pulling said crystalline material from the crystal-forming zone to produce said shaped crystalline fiber.

2. A method according to claim 1 where a crystal-liquid interface is formed in said crystal-forming zone and wherein the cross-sectional area of said shaped fiber is selectively varied by controlling the temperature in said crystal-forming zone to move the crystal-liquid interface to selected locations along the tapered orifice.

3. A method according to claim 1 further characterized in that said orifice is a capillary orifice and said liquid is flowed into said crystal-forming zone by capillary action.

4. A method according to claim 1 wherein said crystalline fiber is treated with a treatment reagent as the fiber is removed from the die orifice.

* * * * *